[US009964985B1](#)

United States Patent
Leong (10) Patent No.: US 9,964,985 B1
(45) Date of Patent: May 8, 2018

(54) RADIO FREQUENCY POWER AMPLIFIER AND METHOD THEREOF

(71) Applicant: Realtek Semiconductor Corp., Hsinchu (TW)

(72) Inventor: Poh-Boon Leong, Pleasanton, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days. days.

(21) Appl. No.: 15/481,710

(22) Filed: Apr. 7, 2017

(51) Int. Cl.
G05F 3/02 (2006.01)
G05F 3/20 (2006.01)
H03F 3/217 (2006.01)
H03F 3/193 (2006.01)
H03F 3/45 (2006.01)
H03F 3/30 (2006.01)

(52) U.S. Cl.
CPC .......... G05F 3/205 (2013.01); H03F 3/1935 (2013.01); H03F 3/2171 (2013.01); H03F 3/3008 (2013.01); H03F 3/3022 (2013.01); H03F 3/45237 (2013.01)

(58) Field of Classification Search
CPC ...... G05F 3/205; H03F 3/1935; H03F 3/2171; H03F 3/3008; H03F 3/3022; H03F 3/45237
USPC ........................................................ 327/537
See application file for complete search history.

(56) References Cited

U.S. PATENT DOCUMENTS

| 9,246,451 | B2 | 1/2016 | Sutardja et al. | |
| 9,312,820 | B2* | 4/2016 | Mostov | H03F 1/0227 |
| 9,413,309 | B1* | 8/2016 | Zhao | H03F 3/193 |
| 2012/0161871 | A1* | 6/2012 | Sutardja | H03F 1/223 330/255 |
| 2012/0161879 | A1* | 6/2012 | Leong | H03F 1/223 330/302 |
| 2012/0161880 | A1* | 6/2012 | Sutardja | H03F 1/223 330/310 |
| 2013/0033325 | A1* | 2/2013 | Ladhani | H03F 1/0288 330/277 |
| 2013/0099865 | A1* | 4/2013 | Do | H03F 1/223 330/277 |
| 2015/0288334 | A1* | 10/2015 | Cai | H03F 1/0205 330/253 |
| 2015/0349732 | A1* | 12/2015 | Leong | H03F 1/565 330/253 |

(Continued)

Primary Examiner — Ryan Jager
(74) Attorney, Agent, or Firm — McClure, Qualey & Rodack, LLP (57) ABSTRACT

An apparatus having a first coupling network configured to receive an input voltage and output a first gate voltage and a second gate voltage at a first gate node and a second gate node, respectively; a stacked complementary common-source amplifier pair including a first common-source amplifier and a second common-source amplifier configured to receive the first gate voltage and the second gate voltage and output a first drain voltage and a second drain voltage at a first drain node and a second drain node, respectively; a second coupling network configured to provide a coupling between the first drain node and the second drain node to equalize the first drain voltage and the second drain voltage. A first inductor and second inductor couple the first and second drain nodes to a first and second DC node, respectively. Third and fourth inductors are coupled to the first and second inductor.

20 Claims, 4 Drawing Sheets

(56) References Cited

U.S. PATENT DOCUMENTS

2015/0372645 A1* 12/2015 Banerjee ................. H03F 3/193
330/251
2016/0373063 A1* 12/2016 Khandavalli ........... H03F 3/193

* cited by examiner

RADIO FREQUENCY POWER AMPLIFIER AND METHOD THEREOF

BACKGROUND OF THE INVENTION

Field of the Invention

The present invention generally relates to power amplifier circuits, and more specifically to a radio frequency power amplifier.

Description of Related Art

Power amplifiers are widely used in many applications. A prior art power amplifier utilizes either a NMOS (n-channel metal oxide semiconductor) transistor or a PMOS (p-channel metal oxide semiconductor) transistor as a gain device configured as a common-source amplifier. When a NMOS (PMOS) transistor is used as the common-source amplifier, a gate terminal of the NMOS (PMOS) transistor is coupled to an input voltage, a source terminal of the NMOS (PMOS) transistor is connected to a ground (power) node, and a drain terminal of the NMOS (PMOS) transistor is coupled to a power (ground) node via an inductor. An output of the common-source amplifier is tapped at the drain terminal of the NMOS (PMOS) transistor.

A first issue of the prior art power amplifier is that, there is an appreciable second order distortion in the output. A second issue is that, while a mean value of the drain-to-source voltage of the transistor, either NMOS or PMOS, is approximately equal to a power supply voltage (which is a voltage difference between the power node and the ground node), a peak value of the drain-to-source voltage can be twice as large when the power amplifier reaches a full output capacity. A high drain-to-source voltage causes a high stress on a transistor and might damage the transistor. For the transistor to remain reliable, a stringent constraint on the power supply voltage must be imposed. This adversely limits the full output capacity of the prior art power amplifier.

What is desired is to provide a power amplifier that overcomes one or more of the above-identified shortcomings.

BRIEF SUMMARY OF THIS INVENTION

What is disclosed is a method and apparatus for alleviating the second order distortion, and also relieving the reliability concern.

In an embodiment, an apparatus includes: a first coupling network configured to receive an input voltage and output a first gate voltage and a second gate voltage at a first gate node and a second gate node, respectively; a stacked complementary common-source amplifier pair including a first common-source amplifier and a second common-source amplifier configured to receive the first gate voltage and the second gate voltage and output a first drain voltage and a second drain voltage at a first drain node and a second drain node, respectively; a second coupling network configured to provide a coupling between the first drain node and the second drain node to equalize the first drain voltage and the second drain voltage; a first inductor configured to couple the first drain node to a first DC node; a second inductor configured to couple the second drain node to a second DC node; a third inductor configured to be inductively coupled with the first inductor; a fourth inductor configured to be inductively coupled with the second inductor; and an output combiner configured to output an output voltage in accordance with a combination of the a voltage of the third inductor and a voltage of the fourth inductor.

In an embodiment, the first DC node is a ground node and the first common-mode amplifier includes a PMOS transistor, wherein a gate terminal of the PMOS transistor connects to the first gate node, a drain terminal of the PMOS transistor connects to the first drain node, and a source terminal of the PMOS transistor connects to a common source node. In an embodiment, the second DC node is a power node and the second common-source amplifier includes a NMOS transistor, wherein a gate terminal of the NMOS transistor connects to the second gate node, a drain terminal of the NMOS transistor connects to the second drain node, and a source terminal of the NMOS transistor connects to the common source node.

In an embodiment, the first coupling network is configured to provide a coupling between the input voltage and the first gate voltage, and also a coupling between the input voltage and the second gate voltage, so that both the first gate voltage and the second gate voltage effectively track the input voltage at a frequency of interest. In an embodiment, the first coupling network includes a capacitor configured to provide a AC (alternative current) coupling between the input voltage and one of the first gate voltage and the second gate voltage. In an embodiment, the first coupling network includes a resistor configured to provide a DC (direct current) coupling between a bias voltage and one of the first gate voltage and the second gate voltage. In an alternative embodiment, the first coupling network includes an inductor configured to provide a DC (direct current) coupling between a bias voltage and one of the first gate voltage and the second gate voltage. In another embodiment, the first coupling network includes a transformer configured to provide a AC (direct current) coupling between the input voltage and one of the first gate voltage and the second gate voltage. In an embodiment, the second coupling network is configured to provide a low impedance at a second harmonic of a frequency of interest. In an embodiment, the second coupling network includes a capacitor. In an embodiment, the second coupling network further includes an inductor in series connection with the capacitor to form a resonance network with a resonant frequency approximately equal to twice of a frequency of interest. In an embedment, the output combiner is configured to combine the voltage of the third inductor and the voltage of the fourth inductor in a serial combination manner. In another embedment, the output combiner is configured to combine the voltage of the third inductor and the voltage of the fourth inductor in a parallel combination manner.

In an embodiment, a method includes: receiving an input signal; coupling the input signal to a first gate signal and a second gate signal at a first gate node and a second gate node, respectively, using a first coupling network; converting the first gate signal and the second gate signal into a first drain signal and a second drain signal using a first common-source amplifier and a second common-source, respectively; shorting a source terminal of the first common-source amplifier to a source terminal of the second common-source amplifier; coupling the first drain signal and the second drain signal to a first DC node and a second DC node via a first inductor and a second inductor, respectively; coupling the first drain signal to the second drain signal using a second coupling network; incorporating a third inductor and a fourth inductor configured to inductively couple to the first inductor and the second inductor, respectively; and combining a voltage of the third inductor and a voltage of the fourth inductor using an output combiner circuit.

In an embodiment, the first DC node is a ground node and the first common-mode amplifier includes a PMOS transistor, wherein a gate terminal of the PMOS transistor connects to the first gate node, a drain terminal of the PMOS transistor connects to the first drain node, and a source terminal of the PMOS transistor connects to a common source node. In an embodiment, the second DC node is a power node and the second common-source amplifier includes a NMOS transistor, wherein a gate terminal of the NMOS transistor connects to the second gate node, a drain terminal of the NMOS transistor connects to the second drain node, and a source terminal of the NMOS transistor connects to the common source node. In an embodiment, the first coupling network is configured to provide a coupling between the input signal and the first gate signal, and also a coupling between the input signal and the second gate signal, so that both the first gate signal and the second gate signal effectively track the input signal at a frequency of interest. In an embodiment, the first coupling network includes a capacitor configured to provide a AC (alternative current) coupling between the input signal and one of the first gate signal and the second gate signal. In an embodiment, the first coupling network includes a resistor configured to provide a DC (direct current) coupling between a bias voltage and one of the first gate signal and the second gate signal. In an alternative embodiment, the first coupling network includes an inductor configured to provide a DC (direct current) coupling between a bias voltage and one of the first gate signal and the second gate signal.

In an another embodiment, the first coupling network includes a transformer configured to provide a AC (direct current) coupling between the input signal and one of the first gate signal and the second gate signal. In an embodiment, the second coupling network is configured to provide a low impedance at a second harmonic of a frequency of interest. In an embodiment, the second coupling network includes a capacitor. In an embodiment, the second coupling network further includes an inductor in series connection with the capacitor to form a resonance network with a resonant frequency approximately equal to twice of a frequency of interest. In an embedment, the output combiner is configured to combine the voltage of the third inductor and the voltage of the fourth inductor in a serial combination manner. In another embedment, the output combiner is configured to combine the voltage of the third inductor and the voltage of the fourth inductor in a parallel combination manner.

DETAILED DESCRIPTION OF THIS INVENTION

The present invention relates to power amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "voltage," "signal," "differential signal," "common mode," "capacitor," "inductor," "resistor," "transistor," "MOS (metal-oxide semiconductor)," "PMOS (p-channel metal oxide semiconductor)," "NMOS (n-channel metal oxide semiconductor)," "AC (alternating current)," "AC couple," "DC (direct current)," "DC couple," "source," "gate," "drain," "node," "ground node," "power node," "serial connection," and "cascode." Those of ordinary skill in the art can also readily recognize a symbol of a MOS transistor, and its associated "source," "gate," and "drain" terminals. Terms and basic concepts like these are apparent to those of ordinary skill in the art and thus will not be explained in detail here.

Throughout this disclosure, "DC" stands for direct current, "AC" stands for alternating current, and "CM" stands for common-mode. A DC node is a node of a substantially fixed electric potential. In particular, "$V_{DD}$" denotes a first DC node referred to as a power node, and "$V_{SS}$" denotes a second DC node referred to as a ground node.

Figure 1:
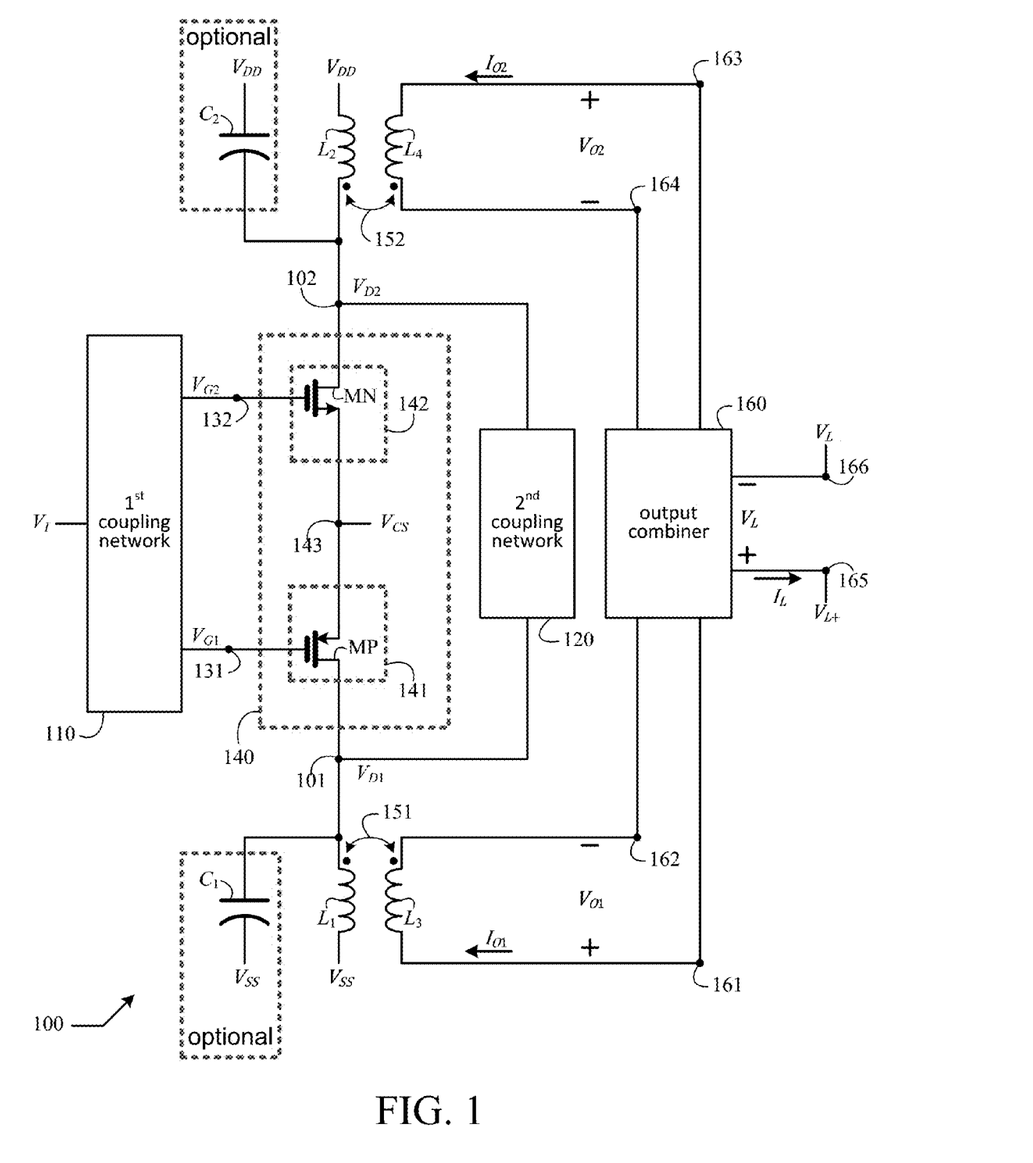
FIG. 1 shows a schematic diagram of a single-ended power amplifier in accordance with an embodiment of the present invention.

A schematic diagram of a single-ended power amplifier 100 in accordance with an embodiment of the present invention is depicted in FIG. 1. The single-ended power amplifier 100 includes: a first coupling network 110 configured to receive an input voltage $V_1$ and output a first gate voltage $V_{G1}$ and a second gate voltage $V_{G2}$ at a first gate node 131 and a second gate node 132, respectively; a stacked complementary common-source amplifier pair 140 including a first common-source amplifier 141 and a second common-source amplifier 142 configured to receive the first gate voltage $V_{G1}$ and the second gate voltage $V_{G2}$ and output a first drain voltage $V_{D1}$ and a second drain voltage $V_{D2}$ at a first drain node 101 and a second drain node 102, respectively, wherein the first common-source amplifier 141 includes a PMOS transistor MP, the second common-source amplifier 142 includes a NMOS transistor MN, the source terminal of the PMOS transistor MP and the source terminal of the NMOS transistor MN are connected to a common source node 143; a second coupling network 120 configured to provide a coupling between the first drain node 101 and the second drain node 102 to equalize the first drain voltage $V_{D1}$ and the second drain voltage $V_{D2}$; a first inductor $L_1$ configured to couple $V_{D1}$ to $V_{SS}$; a second inductor $L_2$ configured to couple $V_{D2}$ to $V_{DD}$; a third inductor $L_3$ configured to be inductively coupled with the first inductor $L_1$ to established a first output voltage $V_{O1}$ across a first pair of output nodes 161 and 162; a fourth inductor $L_4$ configured to be inductively coupled with the second inductor $L_2$ to establish a second output voltage $V_{O2}$ across a second pair of output nodes 163 and 164; and an output combiner 160 configured to establish a load voltage $V_L$ across a first load node 165 and a second load node 166 in accordance with a combination of the first output voltage $V_{O1}$ and the second output voltage $V_{O2}$.

In a practical application, there is a load circuit (not shown in the figure, but apparent to those of ordinary skill in the art) placed between the first load node 165 and the second load node 166. Here, $V_{L+}$ denotes a voltage at the first load node 165, $V_{O-}$ denotes a voltage at the second load node 166, and the load voltage $V_L$ is a difference between $V_{L+}$ and $V_{L-}$, i.e. $V_L = V_{L+} - V_-$. In an optional embodiment, the single-ended power amplifier 100 further comprises a first shunt capacitor $C_1$ configured to shunt the first drain node 101 to $V_{SS}$ and a second shunt capacitor $C_2$ configured to shunt the second drain node 102 to $V_{DD}$. By way of example but not limitation, the input voltage $V_1$ is a modulated signal at a carrier frequency of 5.7 GHz (which is a frequency of interest), $V_{DD}$ is 4V, $V_{SS}$ is 0V, the width/length of the PMOS transistor MP is 1600 μm/270 nm, the width/length of the NMOS transistor MN is 800 μm/270 nm, $L_1$ and $L_2$ are both 400 pH, $L_3$ and $L_4$ are both 550 pH, the mutual coupling coefficient between $L_1$ and $L_3$ and the mutual coupling coefficient between $L_2$ and $L_4$ are both 0.9, $C_1$ is 100 fF, $C_2$ is 200 fF, and the load circuit (not shown in figure but apparent to those of ordinary skill in the art) placed between the first load node 165 and the second load node 166 includes a 25-Ohm resistor.

Figure 2:
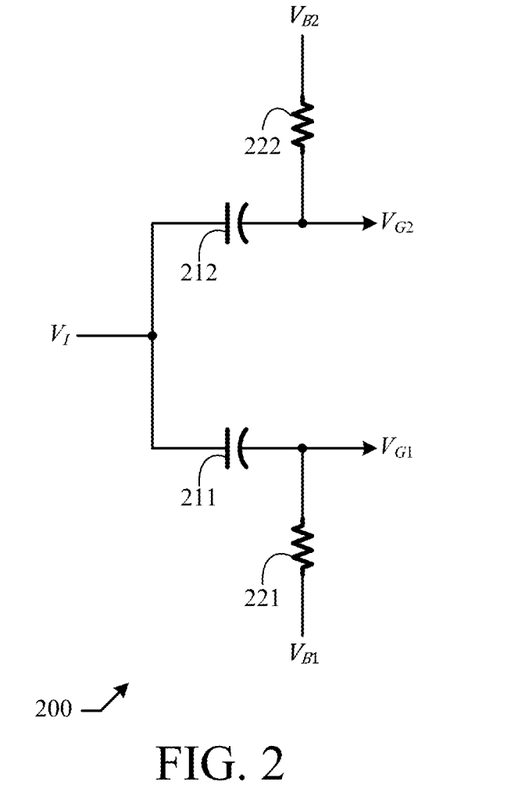
FIG. 2 shows a schematic diagram of a coupling network suitable for embodying the first coupling network of the power amplifier of FIG. 1.

The first coupling network 110 is configured to provide a coupling between the input voltage $V_1$ and the first gate voltage $V_{G1}$, and also a coupling between the input voltage $V_1$ and the second gate voltage $V_{G2}$, so that both the first gate voltage $V_{G1}$ and the second gate voltage $V_{G2}$ effectively track the input voltage $V_1$ at the frequency of interest. A schematic diagram of an AC coupling network 200 suitable for embodying the first coupling network 110 of FIG. 1 is depicted in FIG. 2. The AC coupling network 200 comprises: a first capacitor 211 configured to couple the input $V_1$ to the first gate voltage $V_{G1}$; a second capacitor 212 configured to couple the input voltage $V_1$ to the second gate voltage $V_{G2}$; a first resistor 221 configured to couple a first bias voltage $V_{B1}$ to the first gate voltage $V_{G1}$; and a second resistor 222 configured to couple a second bias voltage $V_{BG2}$ to the second gate voltage $V_{G2}$. Both the first bias voltage $V_{B1}$ and the second bias voltage $V_{B2}$ are substantially stationary. $V_{G1}$ and $V_{G2}$ are thus DC coupled to $V_{B1}$ and $V_{B2}$ via resistors 221 and 222, respectively, but AC coupled to $V_1$ via capacitors 211 and 212, respectively. By way of example but not limitation, the frequency of interest is 5.5 GHz, both resistors 221 and 222 are 10K Ohm, capacitors 211 and 212 are both 30 pF, $V_{B1}$ is 1.3V, and $V_{B2}$ is 2.7V. In an alternative embodiment, one of the two resistors 221 and 222 is replaced by an inductor (not shown in figure). In a yet alternative embodiment, capacitor 211 and resistor 221 are replaced by a first transformer (not shown in figure) configured to couple the input voltage $V_1$ to the first gate voltage $V_{G1}$. In a yet another alternative embodiment, capacitor 212 and resistor 222 are replaced by a second transformer (not shown in figure) configured to couple the input voltage $V_1$ to the second gate voltage $V_{G2}$. That a transformer can be used to provide an AC-coupling between a first voltage to a second voltage is well known in the prior art and thus not described in detail here.

Now referring back to FIG. 1, the two common-source amplifiers 141 and 142 are stacked and share a common source voltage $V_{CS}$ at the common-source node 143. In an embodiment, a DC level of $V_{CS}$ is approximately equal to a mean of $V_{DD}$ and $V_{SS}$. An advantage of the stacked topology is that, for each of the two common-source amplifiers 141 and 142, a peak value of a drain-to-source voltage is approximately reduced by half, compared to that of the prior art power amplifier in which the source terminal is connected to either $V_{SS}$ (for a NMOS based common-source amplifier) or $V_{DD}$ (for a PMOS based common-source amplifier. This helps to alleviate the reliability of the two transistors MP and MN by a factor of approximately two. Although an output capacity of each of two common-source amplifiers 141 and 142 are also reduced by a factor of approximately two, compared to that of the prior art power amplifier, the outputs from the two common-source amplifiers 141 and 142 can be tapped using the third inductor $L_3$ and the fourth inductor $L_4$, respectively, and effectively combined using the output combiner 160. Therefore, the overall output capacity is the same as that of the prior art power amplifier, while the reliability concern is greatly alleviated. This greatly relaxes the constraint on the power supply voltage, and allows using a higher power supply voltage to achieve a greater output capacity.

In a further embodiment (not explicitly depicted in FIG. 1 but can be well appreciated by those of ordinary skill in the art), the first common-source amplifier 141 further includes a first cascode device inserted between the drain terminal of the PMOS transistor MP and the first drain node 101, and the second common-source amplifier 142 further includes a second cascode device inserted between the drain terminal of the NMOS transistor MN and the second drain node 102. Since the first common-source amplifier 141 is based on a PMOS transistor (i.e., MP), the first cascode device needs to be a PMOS transistor. Likewise, the second common-source amplifier 142 is based on a NMOS transistor (i.e. MN), the second cascode device needs to be a NMOs transistor. The concept of incorporating a cascode device into a common-source amplifier to gain a variety of benefits (for instance, providing a better reverse isolation) is well known to those of ordinary skill in the art and thus is not described in detail here.

Still referring to FIG. 1, like the case in the prior art, both of the two common-source amplifiers 141 and 142 introduce second order distortions in their respective outputs $V_{D1}$ and $V_{D2}$. However, a second order distortion of a NMOS based common-source amplifier and a second order distortion of a PMOS transistor based common-source amplifier are opposite. Therefore, the second order distortion in $V_{D1}$ and the second order distortion in $V_{D2}$ are opposite. The second coupling network 120 forces a strong coupling between $V_{D1}$ and $V_{D2}$, thus offsetting their $2^{nd}$ order distortions. As a result, the output voltage $V_O$ may have very small second order distortion.

Figure 3A:
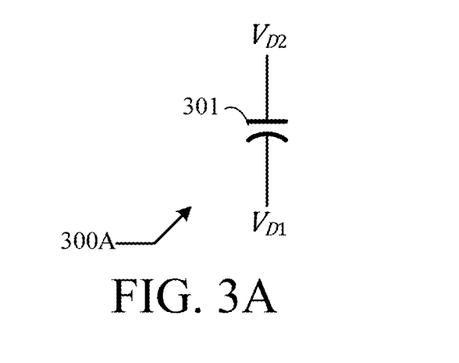
FIG. 3A shows a schematic diagram of a coupling network suitable for embodying the second coupling network of the power amplifier of FIG. 1.

A schematic diagram of an embodiment of a coupling network 300A suitable for embodying the second coupling network 120 of FIG. 1 is depicted in FIG. 3A. The coupling network 300A includes a capacitor 301 configured to couple $V_{D1}$ to $V_{D2}$. By way of example but not limitation, capacitor 301 is 50 pF.

Figure 3B:
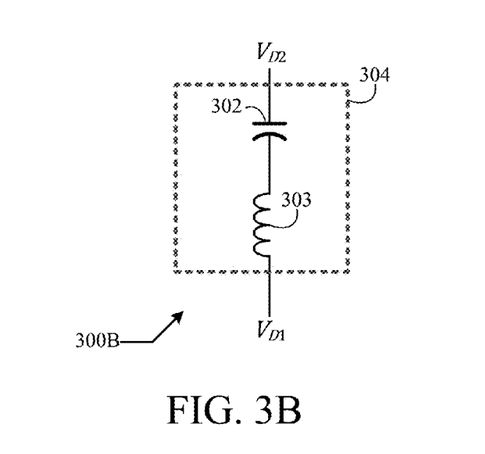
FIG. 3B shows a schematic diagram of an alternative coupling network suitable for embodying the second coupling network of the power amplifier of FIG. 1.

A schematic diagram of an alternative embodiment of a coupling network 300B also suitable for embodying the second coupling network 120 of FIG. 1 is depicted in FIG. 3B. The coupling network 300B includes a serial network 304 constructed by a serial connection of a capacitor 302 and an inductor 303 configured to couple $V_{D1}$ to $V_{D2}$. A resonant frequency of the serial network 304 is equal to a second harmonic of a frequency of the input signal $V_1$ of FIG. 1. By way of example but not limitation, capacitor 302 is 50 pF and inductor 303 is 15 pH. In an embodiment, inductor 303 is embodied by a metal trace.

Still referring to FIG. 1, the output combiner 160 is configured to establish the load voltage $V_L$ across the first load node 165 and the second load node 166 in accordance with a combination of the first output voltage $V_{O1}$ and the second output voltage $V_{O2}$. In one embodiment, the output combiner 160 is configured to connect second load node 164 to node 166, connect node 162 to node 163, and connect node 161 to node 165, so that $$V_L \equiv V_{L+} - V_{L-} = V_{O1} + V_{O2}. \tag{1}$$

As a result, the output voltages delivered from the two common-source amplifiers 141 and 142 are effectively combined. This is referred to as a serial combination embodiment. In an alternative embodiment, the output combiner 160 is configured to connect node 165 to both node 161 and node 163, and also connect second load node 166 to both node 162 and node 164, so that $$I_L = I_{O1} + I_{O2}. \tag{2}$$

Here, $I_{O1}$ is an output current of the third inductor $L_3$, $I_{O2}$ is an output current of the fourth inductor $L_4$, and $I_L$ is a load current deliver to the load to be placed between node 165 and node 166. As a result, the output currents delivered from the two common-source amplifiers 141 and 142 are effectively combined. This is referred to as a parallel combination embodiment.

Figure 4:
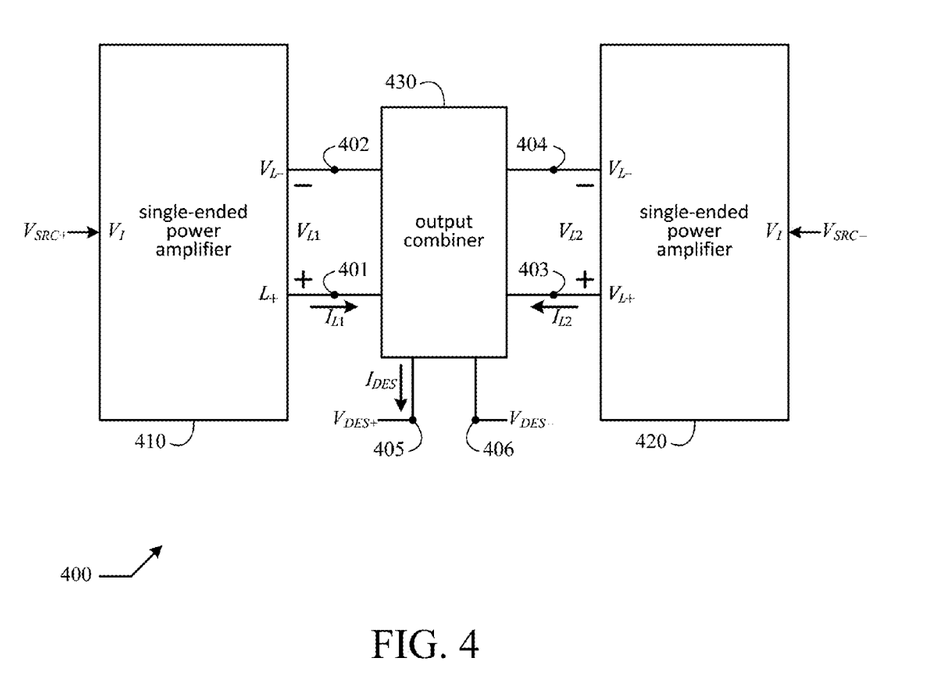
FIG. 4 shows a schematic diagram of a differential power amplifier in accordance with an embodiment of the present invention.

Power amplifier 100 of FIG. 1 is a single-ended power amplifier. Two instances of single-ended power amplifier 100 can be used to form a differential power amplifier. In accordance with an embodiment of the present invention, a schematic diagram of a differential power amplifier 400 is shown in FIG. 4. The differential power amplifier 400 is configured to receive a source signal $V_{SRC}$ and output a destination signal $V_{DES}$. The source signal $V_{SRC}$ is defined as a difference between a first source voltage $V_{SRC+}$ and a second source voltage $V_{SRC-}$, i.e. $V_{SRC} \equiv V_{SRC+} - V_{SRC-}$. Likewise, the destination signal $V_{DES}$ defined as a difference between a first destination voltage $V_{DES+}$ and a second destination voltage $V_{DES-}$, i.e. $V_{DES} \equiv V_{DES+} - V_{DES-}$. The differential power amplifier 400 includes a first instance 410 of single-ended power amplifier and a second instance 420 of single-ended power amplifier, wherein both the first instance 410 and the second instance 420 instantiate the single-ended power amplifier 100 of FIG. 1. In addition, the differential power amplifier 400 includes an output combiner 430.

As illustrated in FIG. 1, when the single-ended power amplifier 100 is instantiated, "$V_1$" denotes an input pin configured to receive its input voltage, and "$V_{L+}$" and "$V_{L-}$" denotes a first output pin and a second output pin, respectively, configured to output its output voltage. Now refer to FIG. 4. The first instance 410 is configured to receive $V_{SRC+}$ via its "$V_1$" pin, and output a first load voltage $V_{L1}$ across a first pair of load nodes 401 and 402 via its "$V_{O+}$" pin and "$V_{O-}$" pin. The second instance 420 is configured to receive $V_{SRC-}$ via its "$V_1$" pin, and output a second load voltage $V_{L2}$ across a second pair of load nodes 403 and 404 via its "$V_{O+}$" pin and "$V_{O-}$" pin. The output combiner 430 is configured to receive the first load voltage $V_{L1}$ and the second load voltage $V_{L2}$ and output the destination signal $V_{DES}$ across a pair of destination nodes 405 and 406. In an embodiment, the output combiner 430 is configured to connect node 405 to node 401, connect node 406 to node 403, and connect node 402 to node 404, so that $$V_{DES} = V_{DES+} - V_{DES-} = V_{L1} - V_{L2}. \tag{3}$$

Here, $V_{DES+}$ and $V_{DES-}$ are voltages at nodes 405 and 406, respectively. The output voltages from the first instance 410 and the second instance 420 are thus effectively combined. This is referred to as a serial connection embodiment. In an alternative embodiment, the output combiner 430 is configured to connect node 405 to both node 401 and node 404, and connect node 406 to both node 402 and node 403, so that $$I_{DES} = I_{L1} - I_{L2}.$$

In a practical application, there is a load circuit (not shown in figure but apparent to those of ordinary skill in the art) placed between the first destination node 401 and the second destination node 402. Here, $I_{L1}$ and $I_{L2}$ are load circuits output from the first instance 410 and the second instance 420, respectively, and $I_{DES}$ is a destination current delivered to the load circuit placed across nodes 405 and 406. The output currents from the first instance 410 and the second instance 420 are thus effectively combined. This is referred to as a parallel combination embodiment.

Figure 5:
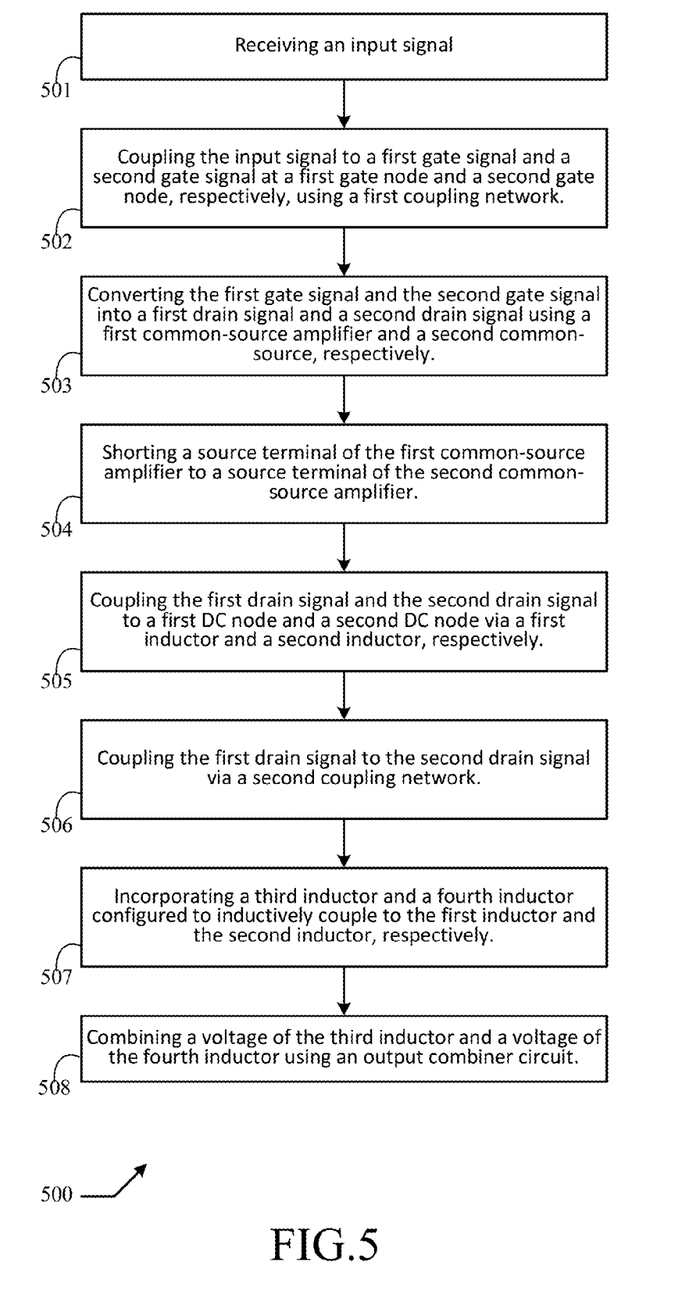
FIG. 5 shows a flow diagram of a method in accordance with the present invention.

In an embodiment illustrated by a flow diagram 500 depicted in FIG. 5, a method comprises: receiving an input signal (Step 501); coupling the input signal to a first gate signal and a second gate signal at a first gate node and a second gate node, respectively, using a first coupling network (Step 502); converting the first gate signal and the second gate signal into a first drain signal and a second drain signal using a first common-source amplifier and a second common-source, respectively (Step 503); shorting a source terminal of the first common-source amplifier to a source terminal of the second common-source amplifier (Step 504); coupling the first drain signal and the second drain signal to a first DC node and a second DC node via a first inductor and a second inductor, respectively (Step 505); coupling the first drain signal to the second drain signal to via a second coupling network (Step 506); incorporating a third inductor and a fourth inductor configured to inductively couple to the first inductor and the second inductor, respectively (Step 507); and combining a voltage of the third inductor and a voltage of the fourth inductor using an output combiner circuit (Step 508).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a first coupling network configured to receive an input voltage and output a first gate voltage and a second gate voltage at a first gate node and a second gate node, respectively;
   a stacked complementary common-source amplifier pair including a first common-source amplifier and a second common-source amplifier configured to receive the first gate voltage and the second gate voltage and output a first drain voltage and a second drain voltage at a first drain node and a second drain node, respectively;
   a second coupling network configured to provide a coupling between the first drain node and the second drain node to equalize the first drain voltage and the second drain voltage;
   a first inductor configured to couple the first drain node to a first DC node;
   a second inductor configured to couple the second drain node to a second DC node;
   a third inductor configured to be inductively coupled with the first inductor; and a fourth inductor configured to be inductively coupled with the second inductor; and an output combiner configured to output an output voltage in accordance with a combination of a voltage of the third inductor and a voltage of the fourth inductor.

2. The apparatus of claim 1, wherein the first DC node is a ground node and the first common-mode amplifier includes a PMOS (p-channel metal oxide semiconductor) transistor, wherein a gate terminal of the PMOS transistor connects to the first gate node, a drain terminal of the PMOS transistor connects to the first drain node, and a source terminal of the PMOS transistor connects to a common source node.

3. The apparatus of claim 2, wherein the second DC node is a power node and the second common-source amplifier includes a NMOS (n-channel metal oxide semiconductor) transistor, wherein a gate terminal of the NMOS transistor connects to the second gate node, a drain terminal of the NMOS transistor connects to the second drain node, and a source terminal of the NMOS transistor connects to the common source node.

4. The apparatus of claim 1, wherein the first coupling network is configured to provide a coupling between the input voltage and the first gate voltage, and also a coupling between the input voltage and the second gate voltage, so that both the first gate voltage and the second gate voltage effectively track the input voltage at a frequency of interest.

5. The apparatus of claim 4, wherein the first coupling network includes a capacitor configured to provide a AC (alternate current) coupling between the input voltage and one of the first gate voltage and the second gate voltage.

6. The apparatus of claim 4, wherein the first coupling network includes a resistor configured to provide a DC (direct current) coupling between a bias voltage and one of the first gate voltage and the second gate voltage.

7. The apparatus of claim 4, wherein the first coupling network includes an inductor configured to provide a DC (direct current) coupling between a bias voltage and one of the first gate voltage and the second gate voltage.

8. The apparatus of claim 4, wherein the first coupling network includes a transformer configured to provide a AC (direct current) coupling between the input voltage and one of the first gate voltage and the second gate voltage.

9. The apparatus of claim 1, wherein the second coupling network is configured to provide a low impedance at a second harmonic of a frequency of interest.

10. The apparatus of claim 1, wherein the second coupling network includes a capacitor.

11. A method comprising:
receiving an input signal;
coupling the input signal to a first gate signal and a second gate signal at a first gate node and a second gate node, respectively, using a first coupling network;
converting the first gate signal and the second gate signal into a first drain signal and a second drain signal using a first common-source amplifier and a second common-source amplifier, respectively;

shorting a source terminal of the first common-source amplifier to a source terminal of the second common-source amplifier;
coupling the first drain signal and the second drain signal to a first DC (direct current) node and a second DC node via a first inductor and a second inductor, respectively;
coupling the first drain signal to the second drain signal via a second coupling network;
incorporating a third inductor and a fourth inductor configured to inductively couple to the first inductor and the second inductor, respectively; and
combining a voltage of the third inductor and a voltage of the fourth inductor using an output combiner circuit.

12. The method of claim 11, wherein the first DC node is a ground node and the first common-mode amplifier includes a PMOS (p-channel metal oxide semiconductor) transistor, wherein a gate terminal of the PMOS transistor connects to the first gate node, a drain terminal of the PMOS transistor connects to a first drain node, and a source terminal of the PMOS transistor connects to a common source node.

13. The method of claim 12, wherein the second DC node is a power node and the second common-source amplifier includes a NMOS (n-channel metal oxide semiconductor) transistor, wherein a gate terminal of the NMOS transistor connects to a second gate node, a drain terminal of the NMOS transistor connects to the second drain node, and a source terminal of the NMOS transistor connects to the common source node.

14. The method of claim 11, wherein the first coupling network is configured to provide a coupling between the input signal and the first gate signal, and also a coupling between the input signal and the second gate signal, so that both the first gate signal and the second gate signal effectively track the input signal at a frequency of interest.

15. The method of claim 14, wherein the first coupling network includes a capacitor configured to provide a AC (alternate current) coupling between the input signal and one of the first gate signal and the second gate signal.

16. The method of claim 14, wherein the first coupling network includes a resistor configured to provide a DC (direct current) coupling between a bias voltage and one of the first gate signal and the second gate signal.

17. The method of claim 14, wherein the first coupling network includes an inductor configured to provide a DC (direct current) coupling between a bias voltage and one of the first gate signal and the second gate signal.

18. The method of claim 14, wherein the first coupling network includes a transformer configured to provide a AC (direct current) coupling between the input signal and one of the first gate signal and the second gate signal.

19. The method of claim 11, wherein the second coupling network is configured to provide a low impedance at a second harmonic of a frequency of interest.

20. The method of claim 11, wherein the second coupling network includes a capacitor.

* * * * *